(12) United States Patent
Winslow

(10) Patent No.: US 7,485,514 B2
(45) Date of Patent: Feb. 3, 2009

(54) METHOD FOR FABRICATING A MESFET

(76) Inventor: Thomas A. Winslow, 2335 Emery Creek, Salem, VA (US) 24153

( * ) Notice: Subject to any disclaimer, the term of this patent is extended or adjusted under 35 U.S.C. 154(b) by 108 days.

(21) Appl. No.: 11/327,257

(22) Filed: Jan. 5, 2006

(65) Prior Publication Data
US 2007/0155072 A1    Jul. 5, 2007

(51) Int. Cl.
H01L 21/338    (2006.01)
H01L 29/812    (2006.01)

(52) U.S. Cl. ............... 438/174; 438/175; 257/E29.317; 257/280

(58) Field of Classification Search ............ 438/174, 438/175, 167, 181, 184, 185; 257/280, 285, 257/E29.317
See application file for complete search history.

(56) References Cited

U.S. PATENT DOCUMENTS

| | | | | |
|---|---|---|---|---|
| 4,452,646 A * | 6/1984 | Zuleeg | ............... | 438/194 |
| H390 H * | 12/1987 | Lee et al. | ............... | 257/282 |
| 4,738,934 A * | 4/1988 | Johnston et al. | ............... | 438/508 |
| 4,783,688 A * | 11/1988 | Shannon | ............... | 257/280 |
| 4,803,526 A * | 2/1989 | Terada et al. | ............... | 257/280 |
| 4,843,441 A * | 6/1989 | Willard | ............... | 257/270 |
| 4,855,246 A * | 8/1989 | Codella et al. | ............... | 438/185 |
| 4,963,501 A * | 10/1990 | Ryan et al. | ............... | 438/183 |
| 5,002,897 A * | 3/1991 | Lewis et al. | ............... | 438/169 |
| 5,187,379 A * | 2/1993 | Noda | ............... | 257/192 |
| 5,196,358 A * | 3/1993 | Boos | ............... | 438/186 |
| 5,367,180 A | 11/1994 | Asai et al. | | |
| 5,376,812 A * | 12/1994 | Oku | ............... | 257/279 |
| 5,532,507 A * | 7/1996 | Wada | ............... | 257/280 |
| 5,536,666 A | 7/1996 | Miller et al. | | |
| 5,565,696 A | 10/1996 | Miller et al. | | |
| 5,578,512 A * | 11/1996 | Tao | ............... | 438/174 |
| 5,688,703 A * | 11/1997 | Klingbeil et al. | ............... | 438/181 |
| 5,804,849 A * | 9/1998 | Wennekers | ............... | 257/280 |
| 5,907,168 A * | 5/1999 | Childs | ............... | 257/256 |
| 6,005,267 A | 12/1999 | Griffin et al. | | |
| 6,114,195 A * | 9/2000 | Nishihori et al. | ............... | 438/180 |
| 6,134,424 A * | 10/2000 | Nishihori et al. | ............... | 455/127.1 |
| 6,236,070 B1 | 5/2001 | Griffin et al. | | |
| 6,359,324 B1 * | 3/2002 | Tichauer | ............... | 257/462 |
| 6,458,640 B1 * | 10/2002 | Li | ............... | 438/167 |
| 6,541,319 B2 * | 4/2003 | Mun et al. | ............... | 438/174 |

(Continued)

FOREIGN PATENT DOCUMENTS

EP    1 806 779 A2 *    7/2007

(Continued)

OTHER PUBLICATIONS

Goud et al., Two-Dimensional Analysis and Design Considerations of High-Voltage Planar Junctions Equipped with Field Plate and Guard Ring, IEEE Transactions on Electron Devices, vol. 38, No. 6, Jun. 1991; pp. 1497-1504.

(Continued)

Primary Examiner—M. Wilczewski

(57) ABSTRACT

A MESFET and method for fabricating a MESFET are provided. The method includes forming an n-type channel portion in a substrate and forming a p-type channel portion in the substrate. A boundary of the n-type channel portion and a boundary of the p-type channel portion define an intrinsic region in the substrate.

17 Claims, 3 Drawing Sheets

U.S. PATENT DOCUMENTS

| | | | |
|---|---|---|---|
| 6,559,513 | B1 | 5/2003 | Miller et al. |
| 6,583,470 | B1 * | 6/2003 | Maki et al. ............... 257/349 |
| 6,620,688 | B2 | 9/2003 | Woo et al. |
| 6,673,645 | B2 * | 1/2004 | Heineke et al. ............ 438/59 |
| 2003/0017660 | A1 * | 1/2003 | Li .......................... 438/174 |
| 2003/0132463 | A1 | 7/2003 | Miyoshi |
| 2005/0062069 | A1 | 3/2005 | Saito et al. |
| 2006/0220154 | A1 * | 10/2006 | Gajadharsing et al. ...... 257/409 |
| 2007/0138515 | A1 | 6/2007 | Winslow |

FOREIGN PATENT DOCUMENTS

| | | | |
|---|---|---|---|
| JP | 61-18180 | * | 1/1986 |
| JP | 2007-184617 | * | 7/2007 |

OTHER PUBLICATIONS

Jaume et al., High-Voltage Planar Devices Using Field Plate and Semi-Resistive Layers, IEEE Transactions on Electron Devices, vol. 38, No. 7, Jul. 1991; pp. 1681-1684.

Feiler et al., Multistep Field Plates for High-Voltage Planar p-n Junctions, IEEE Transactions on Electron Devices, vol. 39, No. 6, Jun. 1992; pp. 1514-1520.

Goud et al., Breakdown Voltage of Field Plate and Field-Limiting Ring Techniques; Numerical Comparison, IEEE Transactions on Electron Devices, vol. 39, No. 7, Jul. 1992; pp. 1768-1770.

Mok et al., A Novel High-Voltage High-Speed MESFET Using a Standard GaAs Digital IC Process, IEEE Transactions on Electron Devices, vol. 41, No. 2, Feb. 1994; pp. 246-250.

Goud et al., Analysis and Optimal Design of Semi-Insulator Passivated High-Voltage Field Plate Structures and Comparison with Dielectric Passivated Structures, IEEE Transactions on Electron Devices, vol. 41, No. 10; Oct. 1994, pp. 1856-1865.

Murray et al., Optimization of Interconnected-Induced Breakdown Voltage in Junction Isolated IC's Using Biased Polysilicon Field Plates, IEEE Transactions on Electron Devices, vol. 44, No. 1, Jan. 1997; pp. 185-189.

Asano et al., Novel High Power AlGaAs/GaAs HFET with a Field-Modulating Plate Operated at 35V Drain Voltage, IEDM 98, pp. 59-62; 1998.

Wada et al., An 0.1-um Voidless Double-Deck-Shaped (DDS) Gate HJFET with Reduced Gate-Fringing-Capacitance, IEEE Transactions on Electron Devices, vol. 46, No. 5, May 1999; pp. 859-864.

Matsunaga et al., A Low-Distortion 230W GaAs Power FP-HFET Operated at 22V for Cellular Base Station, IEDM 2000, pp. 393-396.

Karmalker et al., Enhancement of Breakdown Voltage in AlGaN/GaN High Electron Mobility Transistors Using a Field Plate, IEEE Transactions on Electron Devices, vol. 48, No. 8, Aug. 2001; pp. 1515-1521.

Karmalker et al., Resurf AlGaN/GaN HEMT for High Voltage Power Switching, IEEE Electron Device Letters, vol. 22, No. 8, Aug. 2001; pp. 373-375.

Tarplee et al., Design Rules for Field Plate Edge Termination in SiC Schottky Diodes, IEEE Transactions on Electron Devices, vol. 48, No. 12, Dec. 2001; pp. 2659-2664.

Ando et al., 10-W/mm AlGaN-GaN HFET With a Field Modulating Plate, IEEE Electron Devices Letters, vol. 24, No. 5, May 2003; pp. 289-291.

Ando et al., 12 W/mm Recessed-Gate AlGaN/GaN Heterojunction Field-Plate FET, IEDM 2003, pp. 563-566.

Wakejima et al., A GaAs-Based Field-Modulating Plate HFET with Improved WCHMA Peak-Output-Power Characteristics, IEEE Transactions on Electron Devices, vol. 50, No. 9, Sep. 3; pp. 1983-1987.

Okamoto et al., High-Power Recessed-Gate AlGaN-GaN HFET With a Field-Modulating Plate, IEEE Transactions on Electron Devices, 2004 IEEE; pp. 1-6.

Wu et al., 30-W/mm GaN HEMTs by Field Plate Optimization, IEEE Electron Device Letters, vol. 25, No. 3, Mar. 2004; pp. 117-119.

Okamoto et al., Improved Power Performance for a Recessed-Gate AlGaN-GaN Heterojunction FET With a Field-Modulating Plate, IEEE Transactions on Microwave Theory and Techniques; vol. 52, No. 11; pp. 2536-2540.

Xing et al., High Breakdown Voltage AlGaN-GaN HEMTs Achieved by Multiple Field Plates, IEEE Electron Device Letters, vol. 25, No. 4, Apr. 2004, pp. 161-163.

* cited by examiner

METHOD FOR FABRICATING A MESFET

BACKGROUND OF THE INVENTION

This invention relates generally to semiconductor devices and, more particularly, to a method for fabricating Metal-Semiconductor-Field-Effect-Transistors (MESFETs).

MESFETs, for example, GaAs MESFETs, also referred to as Schottky-gate field-effect transistors (FETs), may be used in a variety of different electronic applications. These applications range from providing switching operations (e.g., high-speed digital switching) to providing signal amplification. Further, these applications encompass commercial, industrial and military uses.

MESFETs are often included in devices for use in microwave frequency communications and radar. These devices, as well as other devices and systems using or incorporating MESFETs have continually increasing power requirements. For example, the desired power output per MESFET device, such as, per transistor surface area continually increases. The power output of transistors also has improved such that a single transistor can provide more power, thereby allowing the use of a reduced number of transistors for a particular application. The use of a reduced number of transistors results in reduced cost, as well as reduced size and weight for a device incorporating transistors. Thus, fewer MESFET may be used, for example, in high power applications.

Known GaAs MESFETs use a metal electrode in direct contact with a doped GaAs channel region to form a Schottky gate junction. A voltage applied to the gate electrode or junction influences the channel carrier density in the vicinity of the gate electrode such that current flows from a drain to a source through the channel region. Essentially, a Schottky barrier is provided as the gate electrode rather than a semiconductor junction. The drain-to-source voltage can be modulated by varying the voltage applied between the gate electrode and one of the other electrodes of the MESFET. Accordingly, switching operation or amplification can be provided using MESFETs.

In operation, the instantaneous source-to-drain voltage of MESFETs may transition from a relatively high value (approximately twice the drain supply voltage) to a small value, with the associated instantaneous drain-to-source current transitioning in the opposite direction. The maximum allowed drain-to-source voltage must be limited so as to not exceed the breakdown voltage of the transistor. The breakdown voltage is generally determined by the structural parameters of the transistor, which may include, for example, the spacing between the gate electrode and the drain electrode, the breakdown field of the substrate material (e.g., germanium, silicon, gallium arsenide, diamond, etc.), the doping levels of the various regions, the dimensions of the doped regions, and the configuration or shape of the gate electrode and adjoining material. Further, the breakdown field of a material is related to the band gap of the material. Thus, materials with larger band gaps can be used to form transistors with higher breakdown voltages.

It is know to manufacture planar MESFETs having improved open channel burnout characteristics by adding a burnout improvement region at the drain contact. The process for manufacturing these planar MESFETs typically includes several implantation steps, for example, first implanting the main FET channel, then providing a coincident deep p-type co-implant that is implanted deeper than the main channel n-type implant. Additionally, a high dose contact implant is then provided that forms a low resistance path to an ohmic drain/source contact. Finally, a burnout improvement (BII) implant is provided and operates as a compensating implant to prevent a p-n$^+$ junction from forming in the drain region of the MESFET channel. Without the BII, there is a strong n$^+$p type reverse biased junction in the drain contact. When the MESFET channel begins to draw current controlled by the gate Schottky, the n$^+$p junction can breakdown by avalanche ionization and cause open channel burnout at low drain voltages. The BII thereby provides a higher breakdown/burnout voltage.

However, it is very difficult to precisely control the n-type BII implant dose and energy in known MESFETs and methods of fabricating MESFETS. In particular, it is difficult to properly and adequately compensate the p-type doping in a small confined region near the drain contact. For example, it is difficult to control the width of the BII region formed by photomask techniques and also to control the dose and energy of the BII implant necessary to repeatedly compensate for the p-type co-implant. The BII implant must be carefully formed, adjusted and controlled to properly compensate for the p-type co-implant. Thus, it is difficult to control the fabrication of the BII of the MESFET. This results in increased variability of and overall reduction in the robustness, for example, the operating range, of the MESFET. Further, these known methods for forming the BII region require an extra processing step through, for example, an ion implanter, which can add time and cost to the process.

BRIEF DESCRIPTION OF THE INVENTION

In an exemplary embodiment, a method for fabricating a Metal-Semiconductor-Field-Effect-Transistor (MESFET) is provided. The method includes forming an n-type channel portion in a substrate and forming a p-type channel portion in the substrate. A boundary of the n-type channel portion and a boundary of the p-type channel portion define an intrinsic region in the substrate.

In another embodiment, a method for fabricating a Metal-Semiconductor-Field-Effect-Transistor (MESFET) is provided. The method includes masking an n-type implant in a substrate to form an n-type channel region and masking a p-type co-implant in the substrate separate from the masking of the n-type implant to form a p-type channel region. The method further includes masking a drain contact implant in the substrate to form a drain contact and wherein an intrinsic region is formed between a side surface of the p-type co-implant, a side surface of the drain contact implant and a bottom surface of the n-type implant.

In yet another embodiment, a Metal-Semiconductor-Field-Effect-Transistor (MESFET) is provided that includes a substrate, a main n-type channel in the substrate and a p-type channel region in the substrate adjacent the n-type channel region and formed by selective masking. The MESFET further includes a drain contact region in the substrate and an intrinsic region between (i) a side boundary of each of the p-type channel region and the drain contact region and (ii) a bottom boundary of the main n-type channel. The intrinsic region is automatically formed by the selective masking of the p-type channel region.

DETAILED DESCRIPTION OF THE INVENTION

Various embodiments of the invention provide a method for fabricating a Metal-Semiconductor-Field-Effect-Transistor (MESFET) having a burnout improvement (BII) region formed by a selectively masked region within the MESFET. In general, a masking process, and more particularly, a photomasking process is provided that allows for the selective implantation of a p-type co-implant that is separate from a blanket n-type implantation. Accordingly, a BII region is formed by selective masking of the p-type co-implant, to separate the BII region from the n+ contact implant region.

Figure 1:
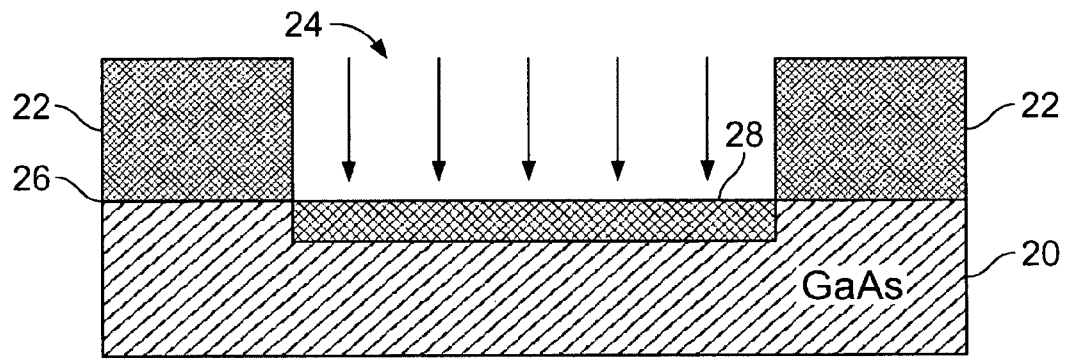
FIG. 1 is a cross-sectional view illustrating a main n-type channel implant masked on a substrate to form part of a Metal-Semiconductor-Field-Effect-Transistor (MESFET) in accordance with an embodiment of the invention.

More particularly, and with reference to FIGS. 1 through 7, the fabrication of a MESFET having a BII region in accordance with an exemplary embodiment of the invention is shown. The Figures generally represent the steps or processes of a fabrication method in accordance with various embodiments for fabricating the MESFET. Each subsequent Figure generally corresponds to the next step or process in fabricating the MESFET. However, it should be noted that the order of the steps and the specific processes within each of the steps may be modified as desired or needed. Specifically, as shown in FIG. 1, a semiconductor wafer or substrate 20 is provided. For example, the substrate 20 may be formed of gallium arsenide (GaAs). The substrate 20 is coated with a photoresist mask 22 and patterned to form an opening 24. The photoresist mask 22 may be provided using any light sensitive material used to form a patterned coating on a surface 26 of the substrate 20 to form the opening 24. It should be noted that the photoresist mask 22 may be a positive resist mask in which the exposed areas become more soluble, for example, in specific chemical solutions (e.g., resist developers) and are removed in the forming process, or a negative resist mask, in which only the exposed areas become resistant (e.g., to the developer), such that the unexposed areas are removed during the forming process.

A main n-type channel region 28, which in an exemplary embodiment is an n doped channel region, is implanted within the substrate 20 using any known and suitable process in the art. For example, the n-type channel region 28 may be implanted using epitaxial layer growth on the substrate 20, followed by electrical isolation of a desired channel area, for example, within the opening 24. As another example, the n-type channel region 28 may be implanted using selective ion implantation of suitable dopants in desired regions of the substrate 20, for example, within the opening 24.

Figure 2:
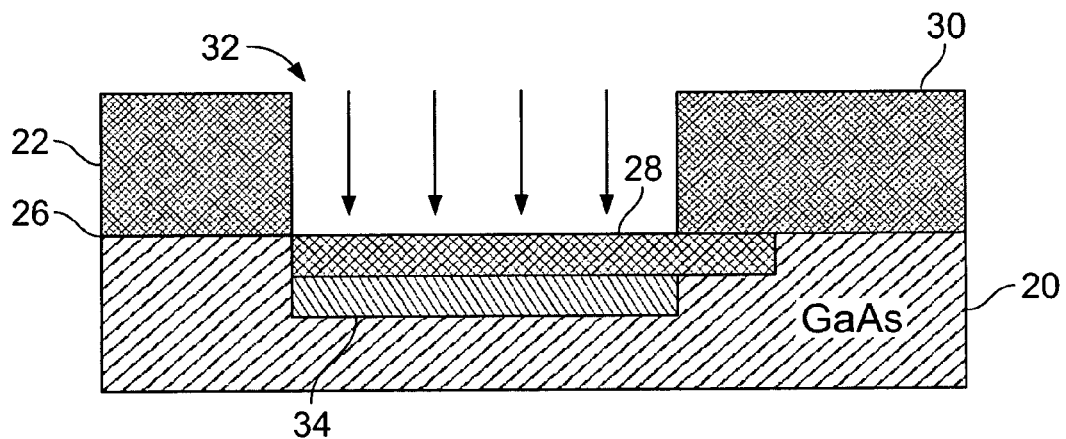
FIG. 2 is a cross-sectional view illustrating a p-type channel co-implant masked to form part of a MESFET in accordance with an embodiment of the invention.

Referring now to FIG. 2, the substrate 20 is again coated with a photoresist mask 30 and patterned to form an opening 32. A p-type channel region 34, which in an exemplary embodiment is a p doped channel region, is implanted within the substrate 20 using any known and suitable process in the art. More particularly, the p-type channel region 34 is co-implanted within the opening 32, which was formed by the photoresist mask 30. It should be noted that the selectively masked p type co-implant is formed using higher implantation energy than the corresponding blanket n channel implant, thereby placing the p type co-implant will be placed deeper into the substrate 20.

Figure 3:
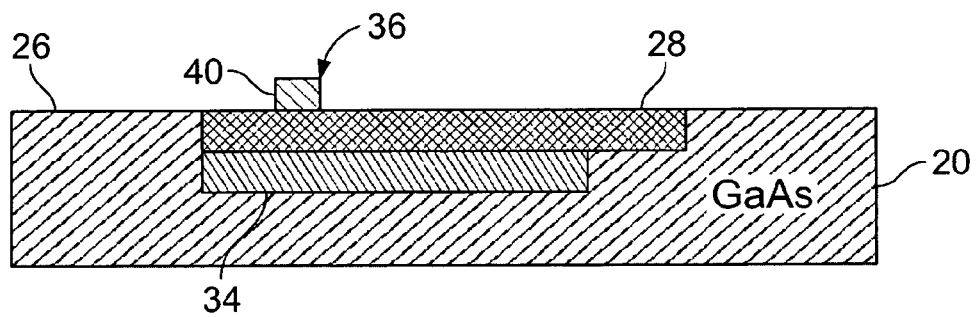
FIG. 3 is a cross-sectional view illustrating a gate contact provided to form part of a MESFET in accordance with an embodiment of the invention.

The portions of the photoresist masks 22 and 30 are then removed as shown in FIG. 3. The photoresist masks 22 and 30 may be removed using any known and suitable process in the art to thereby form a planar surface at the surface 26. A gate contact 36 is then formed on the surface 26. For example, an electrode contact defining the gate contact 36 may be formed by a gate metallization 40. For example, metallization can be selectively deposited on the surface 26 to form the gate Schottky contact capable of withstanding typical anneal temperatures (e.g., above 750 degrees Celsius) without degradation of Schottky barrier properties. For example, metallizations that may be used to form a Schottky gate include, but are not limited to, titanium-tungsten, titanium-tungsten nitride, tungsten nitride, and tungsten silicide, among others. Portions of the metallizations are then removed, for example, by plasma or reactive-ion etchings, to define a metal electrode forming the gate contact 36. It should be noted that the dimensions of the gate contact 36 may be defined during the formation process using a metal etch mask (not shown) formed on top of the metallization using any known and suitable process in the art.

Figure 4:
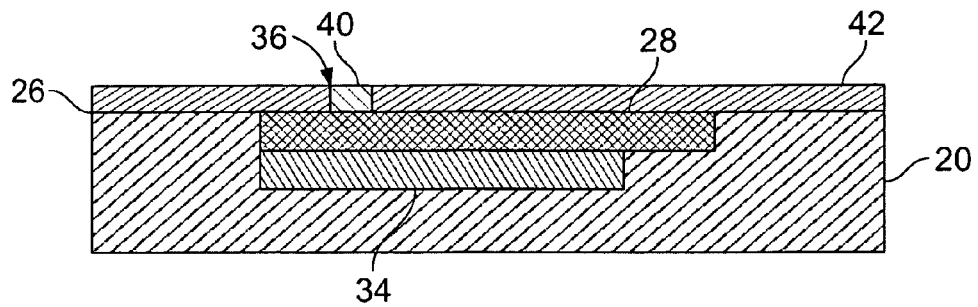
FIG. 4 is a cross-sectional view illustrating a passivation layer provided to form part of a MESFET in accordance with an embodiment of the invention.

Thereafter, as shown in FIG. 4, surface planarization and passivation is performed on the surface 26 using any known and suitable process in the art. In general, surface passivation of the surface 26 may include, for example, the termination of bonds on the semiconductor surface with other elements to provide chemical stability of the surface 26, and in particular, to make the surface 26 chemically passive. For example, surface passivation may be performed by oxidation, nitridation, and/or sulfidation, among others. In particular, a passivation layer 42 is deposited on the surface 26. For example, a nitride material, such as a Silicon oxy-nitride film, may be deposited on the surface 26.

Figure 5:
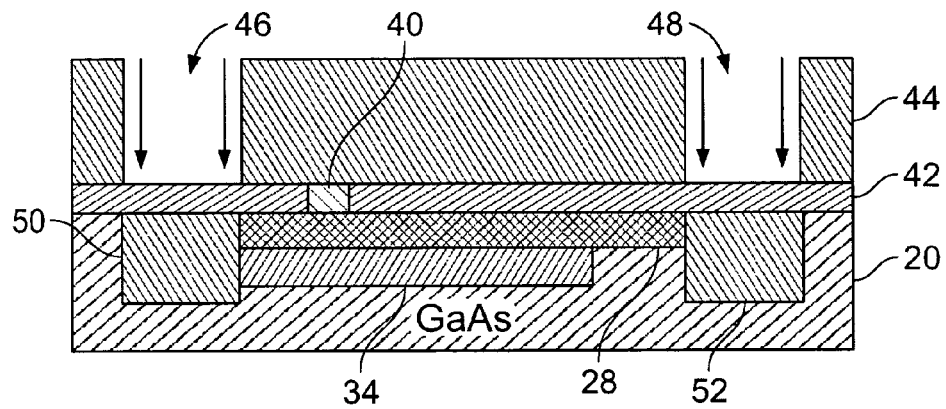
FIG. 5 is a cross-sectional view illustrating n+ contact implants masked to form part of a MESFET in accordance with an embodiment of the invention.

Next, as shown in FIG. 5, the passivation layer 42 is coated with a photoresist mask 44 and patterned to form openings 46 and 48. An n+ doped contact 50 and an n+ doped contact 52 are then implanted within the openings 46 and 48, respectively. For example, an n+ contact is implanted within each of the openings 46 and 48. The openings 46 and 48 are formed asymmetrically with respect to the gate contact 36. The n doped contact 50 defines an n+ source region, which in an exemplary embodiment, is adjacent the gate contact 36. The n doped contact 52 defines an n+ drain region, which in an exemplary embodiment, is separated from the gate contact 36.

Figure 6:
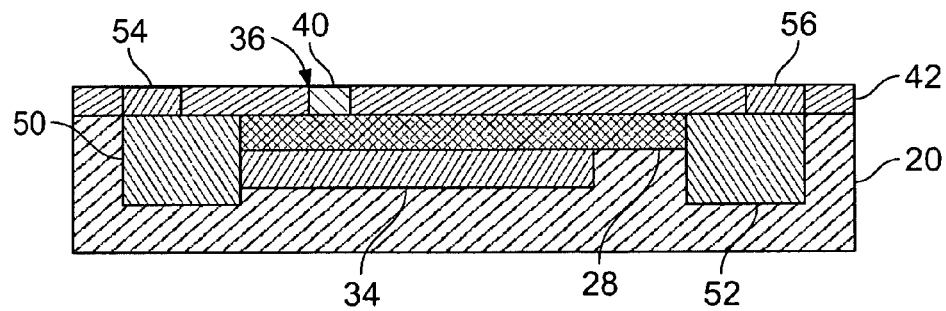
FIG. 6 is a cross-sectional view illustrating ohmic contacts provided to form part of a MESFET in accordance with an embodiment of the invention.

The photoresist mask 44 is then removed as shown in FIG. 6. The passivation layer 42 and the gate contact 36 optionally then may be encapsulated with a suitable dielectric (not shown). For example, silicon oxy-nitride, silicon dioxide and/or silicon nitride may be used for encapsulation. The encapsulated structure then may be annealed at a predetermined temperature and time period, for example, to remove ion implant damage from the substrate 20 and activate the implanted dopant ions. For example, annealing temperatures may be in the range of 750 to 1000 degrees Celsius. If encapsulation is provided, then after annealing, the dielectric layer (not shown) is removed from the surface of the gate contact 36 and the remaining dielectric layer polished down to a predetermined thickness. A pair of openings are then created in the dielectric layer above the source and drain regions having the n doped contact 50 and the n doped contact 52, respectively.

Referring again to FIG. 6, after removing the photoresist mask 44, a source ohmic contact 54 and a drain ohmic contact 56, defining source and drain electrodes are formed on the n+ doped contacts 50 and 52, respectively. In particular, the source ohmic contact 54 and the drain ohmic contact 56 provide ohmic contacts for the source region and the drain region, respectively. The source ohmic contact 54 and the drain ohmic contact 56 may be deposited by, for example, evaporation and liftoff as is known in the art. The source ohmic contact 54 and the drain ohmic contact 56 may be formed of different materials, for example, a mixture of gold, germanium and nickel. In an exemplary embodiment, the source ohmic contact 54 and the drain ohmic contact 56 are formed in the same plane or layer as the gate contact 36.

Figure 7:
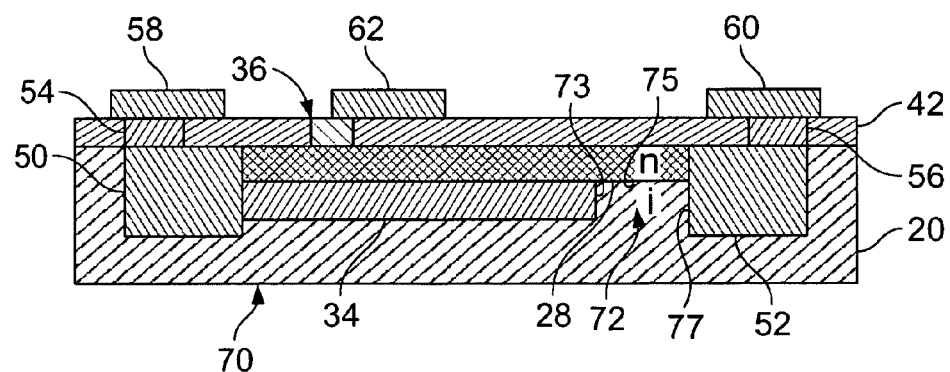
FIG. 7 is a cross-sectional view illustrating metallization layers formed on the ohmic contacts of FIG. 6 to form part of a MESFET in accordance with an embodiment of the invention.

Thereafter, as shown in FIG. 7, metallization layers 58 and 60 are deposited on the source ohmic contact 54 and the drain ohmic contact 56, respectively. The metallization layers 58 and 60 may be formed of different materials, which in an exemplary embodiment is gold. Optionally, a gate field plate 62 may be formed over at least a portion of the gate contact 36 using any known or suitable process in the art. The MESFET 70 shown in FIG. 7 and formed by the various processes described herein includes a p-type co-implant, namely the p-type channel region 34, that is selectively masked, and with the main n-type channel region 28 and the n doped contact 52 forming the n+ drain region, defines an intrinsic region, and more particularly, a BII region 72 or intrinsic BII region. Specifically, a side boundary, and more particularly, a side surface 73 (right side as shown in FIG. 7) of the p-type channel region 34 in combination with a portion of a bottom boundary, and more particularly, a portion of a bottom surface 75 of the n-type channel region 28, and a portion of a side boundary, and more particularly a portion of a side surface 77 (left side as shown in FIG. 7) of the n doped contact 52 defines the intrinsic region.

Figure 8:
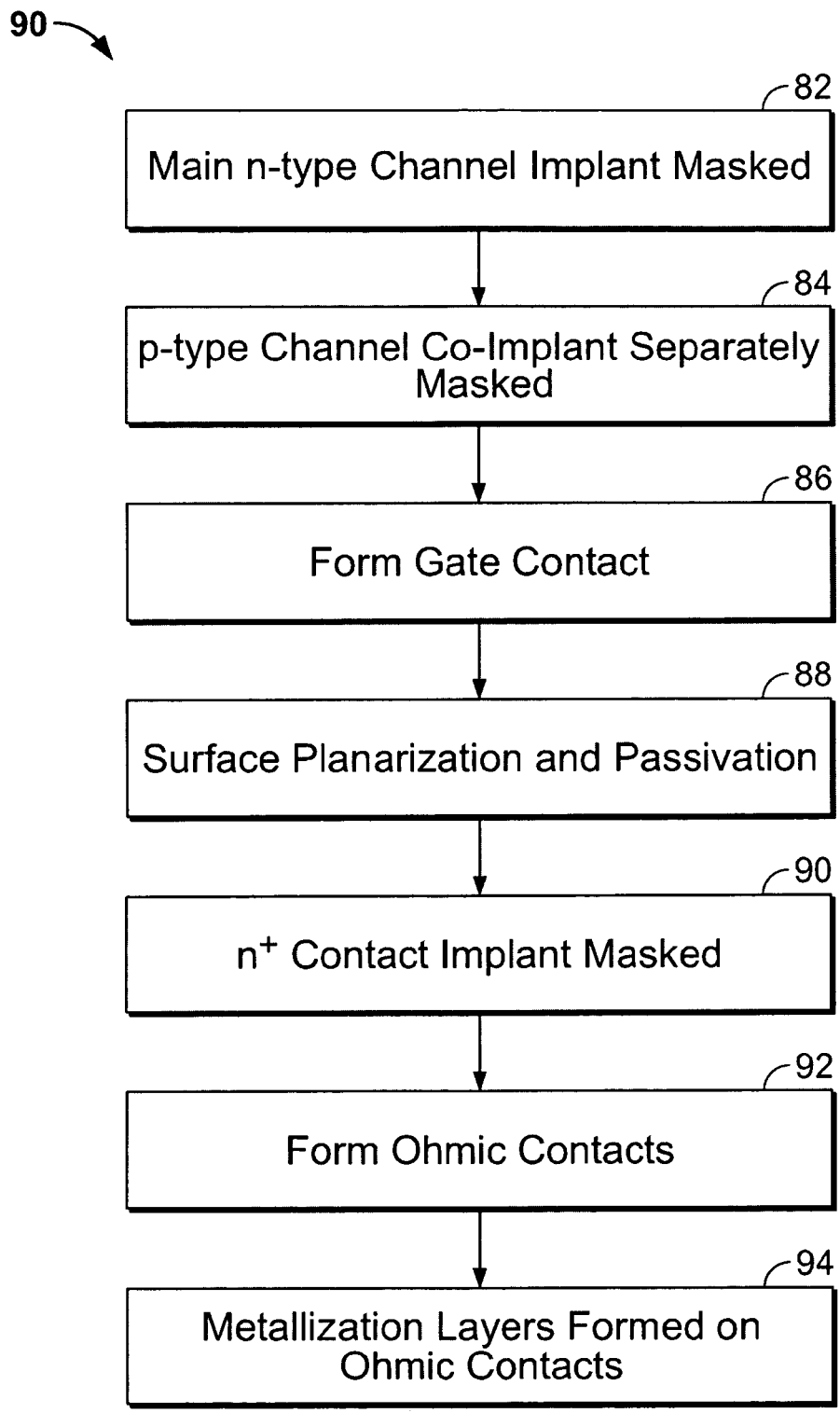
FIG. 8 is a method for fabricating a MESFET in accordance with various embodiments of the invention.

A method 90 for fabricating a MESFET in accordance with various embodiments of the invention is shown in FIG. 8. More particularly, a main N-type channel implant is masked at 82, which in an exemplary embodiment results in the structure shown in FIG. 1. Thereafter, at 82, a p-type channel co-implant is separately masked and which in an exemplary embodiment results in the structure shown in FIG. 2. A gate contact is then formed on the main n-type channel implant at 86 and which in an exemplary embodiment results in the structure shown in FIG. 3. Surface planarization and passivation is then performed at 88 and which in an exemplary embodiment results in the structure shown in FIG. 4. Contacts, and more particularly, n+ contact implants are masked at 90 and which in an exemplary embodiment results in the structure shown in FIG. 5. Thereafter, ohmic contacts are formed corresponding to the n+ contacts at 92 and which in an exemplary embodiment results in the structure shown in FIG. 6. Finally, metallization layers are formed on the ohmic contacts at 94 and which in an exemplary embodiment results in the MESFET shown in FIG. 7. Optionally, a gate field plate may be formed over a portion of the gate contact.

Thus, various embodiments of the invention eliminate the need to use selective implantation of an n-type dopant into the MESFET drain region to create the intrinsic BII region. Accordingly, a precisely controlled ion implantation step through a selectively masked region within the MESFET active body is not needed. Using a masking process, and more particularly, a photomasking process, allows for the selective and controlled implantation of the p-type co-implant that is separate from a blanket n-type implantation step. This photomask process prevents or reduces the likelihood that the p-type co-implant forms a reverse biased $n^+p$ junction at the drain n+ contact. Selectively masking the p-type co-implant eliminates the need for the selective masking and implantation of the BII region, that requires precise control in order to prevent formation of the reverse biased junction at the drain. The open channel burnout implant compensated region is formed without the need for a separate BII implantation by selectively masking the blanket p-type co-implant, thereby forming an intrinsic region between the p-type co-implant and the $n^+$ drain contact implant.

Thus, the BII region is formed based on a selective masking of the p-type co-implant and not an implantation step. Accordingly, various embodiments do not necessarily need precise calculations and control of a specific n-type BII implant to compensate for the p-type co-implant to form an intrinsic region between the p-type co-implant and the n+ drain contact implant. The BII region is formed automatically by preventing the p-type co-implant from approaching the n+ contact implant. Accordingly, a repeatable $n^+$-i-p burnout improvement region is formed that provides improved open channel burnout.

While the invention has been described in terms of various specific embodiments, those skilled in the art will recognize that the invention can be practiced with modification within the spirit and scope of the claims.

What is claimed is:

1. A method for fabricating a Metal-Semiconductor-Field-Effect-Transistor (MESFET), the method comprising:
   forming an n-type channel portion in a substrate having a single n-doped channel region formed using a single implantation step; and
   forming a p-type channel portion in the substrate, a boundary of the n-type channel portion and a boundary of the p-type channel portion defining an intrinsic region in the substrate.

2. A method in accordance with claim 1 further comprising forming at least one contact region in the substrate adjacent the intrinsic region and wherein the intrinsic region is between a side boundary of the p-type channel portion, a side boundary of the at least one contact region and a bottom boundary of the n-type channel portion.

3. A method in accordance with claim 2 wherein the at least one contact region comprises an n+ drain contact implant.

4. A method in accordance with claim 1 wherein forming the n-type channel portion comprises masking an n-type implant.

5. A method in accordance with claim 1 wherein forming the p-type channel portion comprises selectively and separately masking a p-type co-implant separate from an n-type implant forming the n-type channel portion above the p-type channel.

6. A method in accordance with claim 1 wherein forming the n-type channel portion and forming the p-type channel portion comprises using a photoresist mask to define regions for implanting the n-type channel portion and the p-type channel portion.

7. A method in accordance with claim 1 wherein the substrate comprises gallium arsenide (GaAs).

8. A method in accordance with claim 1 wherein the intrinsic region comprises a burnout improvement (BII) region configured as a compensating implant to prevent a $p-n^+$ junction from forming in a drain region.

9. A method in accordance with claim 1 wherein the n-type channel portion defines a main channel and the p-type channel portion defines a smaller channel.

10. A method for fabricating a Metal-Semiconductor-Field-Effect-Transistor (MESFET), the method comprising:
    masking an n-type implant in a substrate to form an n-type channel region using a single implantation step;
    masking a p-type co-implant in the substrate separate from the masking of the n-type implant to form a p-type channel region; and
    masking a drain contact implant in the substrate to form a drain contact and wherein an intrinsic region is formed on one side by an entire side surface of the p-type co-implant, on another side by a side surface of the drain contact implant and on another side by a bottom surface of the n-type implant.

11. A method in accordance with claim 10 wherein masking the p-type co-implant comprises selectively masking the p-type co-implant.

12. A method in accordance with claim 10 wherein masking the p-type co-implant comprises photomasking.

13. A method in accordance with claim 10 wherein the intrinsic region comprises a burnout improvement region configured as a compensating $n^+$-i-p burnout improvement region.

14. A method in accordance with claim 10 wherein the n-type channel region comprises a main channel portion.

15. A method in accordance with claim 10 further comprising passivizing a surface of the substrate above the n-type channel region.

16. A method in accordance with claim 10 wherein the n-type implant is masked before masking the p-type co-implant.

17. A method in accordance with claim 10 further comprising configuring the intrinsic region to reduce open channel burnout.

* * * * *